(12) United States Patent
Camacho et al.

(10) Patent No.: US 8,497,786 B2
(45) Date of Patent: Jul. 30, 2013

(54) CAPACITIVE KEYBOARD WITH ENHANCED ELECTRODE AREAS

(75) Inventors: Oscar Alejandro Camacho, Jalisco (MX); Daniel G. Morfin, Jalisco (MX)

(73) Assignee: Freescale Semiconductor, Inc., Austin, TX (US)

( * ) Notice: Subject to any disclaimer, the term of this patent is extended or adjusted under 35 U.S.C. 154(b) by 1157 days.

(21) Appl. No.: 12/411,623

(22) Filed: Mar. 26, 2009

(65) Prior Publication Data

US 2010/0245135 A1 Sep. 30, 2010

(51) Int. Cl.
*H03K 17/94* (2006.01)

(52) U.S. Cl.
USPC .............................................. 341/33; 345/173

(58) Field of Classification Search
USPC ..................... 341/10, 22, 33, 20, 23; 345/156, 345/168, 173, 174; 324/658–662; 178/18.05, 178/18.06
See application file for complete search history.

(56) References Cited

U.S. PATENT DOCUMENTS

| | | | | |
|---|---|---|---|---|
| 5,463,388 | A * | 10/1995 | Boie et al. ........................ | 341/33 |
| 6,188,391 | B1 * | 2/2001 | Seely et al. ..................... | 345/173 |
| 6,297,811 | B1 * | 10/2001 | Kent et al. ..................... | 345/173 |
| 6,323,846 | B1 * | 11/2001 | Westerman et al. .......... | 345/173 |
| 7,098,897 | B2 | 8/2006 | Vakil et al. | |
| 7,202,859 | B1 * | 4/2007 | Speck et al. ................... | 345/174 |
| 7,821,502 | B2 * | 10/2010 | Hristov .......................... | 345/173 |
| 8,059,015 | B2 * | 11/2011 | Hua et al. ........................ | 341/33 |
| 8,072,429 | B2 * | 12/2011 | Grivna .......................... | 345/173 |
| 8,194,047 | B2 * | 6/2012 | Hsieh et al. .................... | 345/173 |
| 2005/0030048 | A1 * | 2/2005 | Bolender et al. .............. | 324/661 |
| 2006/0097991 | A1 * | 5/2006 | Hotelling et al. ............. | 345/173 |
| 2006/0097992 | A1 | 5/2006 | Gitzinger et al. | |
| 2006/0232557 | A1 * | 10/2006 | Fallot-Burghardt .......... | 345/168 |
| 2007/0008299 | A1 * | 1/2007 | Hristov .......................... | 345/173 |
| 2007/0132737 | A1 * | 6/2007 | Mulligan et al. .............. | 345/173 |
| 2007/0229470 | A1 * | 10/2007 | Snyder et al. ................. | 345/173 |
| 2007/0273560 | A1 * | 11/2007 | Hua et al. ......................... | 341/33 |
| 2007/0279395 | A1 * | 12/2007 | Philipp et al. ................. | 345/173 |
| 2008/0088595 | A1 * | 4/2008 | Liu et al. ....................... | 345/173 |
| 2008/0136784 | A1 | 6/2008 | Neoh et al. | |
| 2008/0143679 | A1 | 6/2008 | Harmon et al. | |
| 2010/0302201 | A1 * | 12/2010 | Ritter et al. ................... | 345/174 |

* cited by examiner

*Primary Examiner* — Brian Zimmerman
*Assistant Examiner* — An T Nguyen
(74) *Attorney, Agent, or Firm* — Terrile, Cannatti, Chambers & Holland, LLP; Michael Rocco Cannatti (57) ABSTRACT

A touch sensitive capacitive keypad (200) is provided that multiple electrodes (201-210) and associated wire connectors (220-229) formed under a touch panel in a single layer of conductive material, where the electrodes (201-210) are arrayed in relation to a keypad to form unique combinations of two electrodes per key, where each electrode is shared with only immediately adjacent keys. The electrodes are sized and arranged so that a first electrode (e.g., electrode E4 205) associated with a given key (e.g., the "5" key) is sized and arranged so that it is shared by only surrounding keys (e.g., the "4," "7," and "8" keys), while a second electrode (e.g., electrode E3 204) associated with the given key (e.g., the "5" key) is sized and arranged so that it is shared by only surrounding keys (e.g., the "2," "3" and "6" keys). As a result, the area for each capacitive electrode is at least twice the area of a given key.

20 Claims, 3 Drawing Sheets

CAPACITIVE KEYBOARD WITH ENHANCED ELECTRODE AREAS

BACKGROUND OF THE INVENTION

1. Field of the Invention

The present invention is directed in general to field of user interfaces and user control of an electronic device. In one aspect, the present invention relates to a method, apparatus and system for determining the location of an object on a keypad or device having a touch sensitive surface.

2. Description of the Related Art

Touch panels are increasingly used in a variety of electronic devices, such as cellular telephones, appliances, industrial equipment, MP3 players, personal digital assistants (PDAs), tablet computers and other similar portable electronic devices. A touch panel typically includes an input touch screen, keypad or buttons for providing data entry, invoking applications, setting up system commands, and menu traversing. For example, cellular phones typically have a conventional pushbutton telephone keypad layout, with the addition of specialized keys for operating the cellular phone. Touch panels have advantages over conventional solutions since touch panels do not have complex mechanical parts that can be expensive to manufacture and can wear out or break. In addition, touch panels can be completely sealed to the external environmental conditions that can degrade the contacts or get inside the product provoking malfunctions.

Capacitive touch sensing techniques are often used with touch panels to detect a change in a signal due to capacitive coupling created by a touch on the touch panel. Such capacitive sensors include one or more electrodes in the touch panel below each keypad, where each electrode forms one capacitor plate and the object being detected (e.g., a human finger) forms the other capacitor plate. In operation, an electric field that is applied to electrodes below the touch panel is changed or altered in the vicinity of a detected touch because the touch capacitively couples with the electrode(s). The change in the field is detected and used to determine the touch location. With touch panel designs, there a number of design constraints that can limit the accuracy of touch detection and/or increase the processing or fabrication complexity. For example, larger electrodes are more sensitive to detecting electric field variations, but there are size constraints for keypads with certain types of electronic devices, such as portable media devices, mp3 players, cell phones, etc. In addition, when electrode sizes are maximized within a small keypad area (e.g., a 4 cm×4 cm area for a numeric key pad of 12 keys), a finger that presses an intended key will also press down on one or more surrounding keys, which complicates the detection process by requiring sensors with higher sensitivities, analog to digital interfaces with more resolution or accurate signal conditioning stages to be able to distinguish between a valid and an invalid touch. Other design constraints are posed by the type and thickness of dielectric material used to form a touch panel, since the variation of the capacitance c is proportional to the area A of two parallel plates times the dielectric constant k of the object between them and inverse to the distance d between the plates. These constraints can impose minimal and maximum electrode area requirements for providing a threshold level of detection accuracy with a typical 12 key numeric keypad configuration.

Accordingly, a need exists for an improved capacitive touch sensing keypad that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

An apparatus, system and methodology are described for providing a capacitive keypad with enhanced electrode areas by increasing the effective capacitive area of the keypad keys while reducing interference between keys to improve the sensitivity and signal-to-noise ratio in touch panel and touch screen applications such as portable electronics, cell phones or other appliances. In selected embodiments, the capacitive electrodes are arranged on a keypad so that each key is detected with a combination of two capacitive electrodes, where each capacitive electrode is shared by four keys that are adjacent to one another without extending across an entire row or column of the keypad, where two keys may be internally or peripherally adjacent to one another. For example, a first capacitive electrode may be shared by the "4," "5," "7," and "8" keys; a second capacitive electrode may be shared by the "2," "3" "5," and "6" keys; a third capacitive electrode may be shared by the "1," "4," "6," and "9" keys; a fourth capacitive electrode may be shared by the "8," "9," "0", and "#" keys; a fifth capacitive electrode may be shared by the "1," "2," "*," and "0" keys; and a sixth capacitive electrode may be shared by the "3," "7," "*," and "#" keys. By creating combinations of two electrodes per key which are multiplexed so that internally adjacent keys, both vertically and horizontally, share one and only one electrode as its neighbor key, the shared or common capacitive electrode will be used, in selected embodiments, by four keys at the same time and will have at least twice the area of a single key, improving in the same proportion the keypad sensitivity. By sharing a common capacitive electrode across multiple keys without extending across an entire row or column of the keypad, the need for having any clearance or discontinuity between keys may be reduced or eliminated while maximizing the electrode area. In addition, this configuration can alleviate the signal processing and signal conditioning requirements for distinguishing valid key touches. While a variety of different geometries and shapes for the electrodes may be used, rhomboid or diamond shaped electrodes are used in selected embodiments to ensure that each key uses two electrodes with exactly the same area per key and that each surrounding key contains one of the electrodes required for its multiplexed combination. With this arrangement, the total area for each electrode doubles the size of a single electrode per pad while having the flexibility of multiplexing electrodes to increase logic combinations. In addition, the multiplexing of shared or common capacitive electrode combinations increases the total number of keys with the same amount of capacitive sensing channels without sacrificing sensitivity. The multiplexing of shared or common electrodes also reduces the total number of physically distinct electrodes which allows the entire keypad to be manufactured with a single metal layer process, such as a single-sided printed circuit board, an Indium Tin Oxide (ITO) touch screen or membrane sensor arrangement.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Where the embodiments described herein are implemented primarily in combinations of method steps and device components related to user function activation on an electronic device, the device components and method steps have been represented where appropriate by conventional symbols in the drawings. Such descriptions and representations are used by those skilled in the art to describe and convey the substance of their work to others skilled in the art. Various illustrative embodiments of the present invention will now be described in detail below with reference to the figures.

Figure 1:
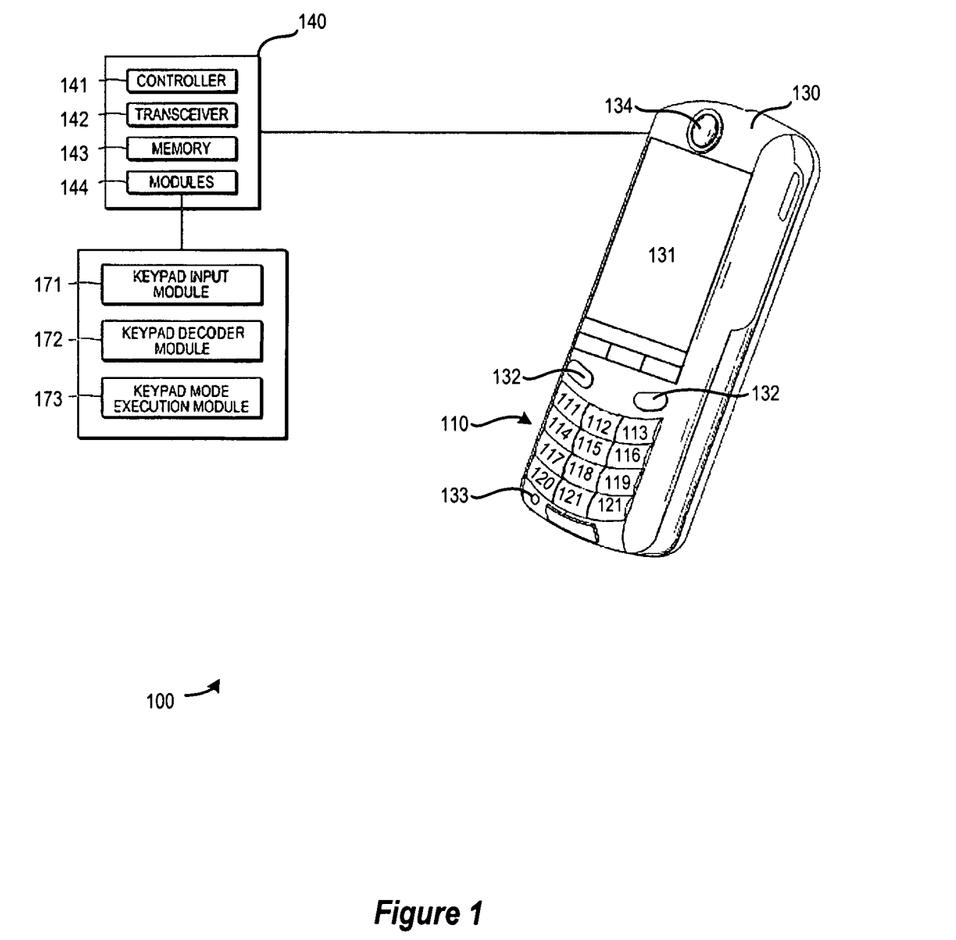
FIG. 1 depicts a mobile communication device including a capacitive touch sensing keypad in accordance with selected embodiments of the present invention.

Turning now to FIG. 1, there is depicted a mobile communication device including 100 a capacitive touch sensing keypad 110 in accordance with selected embodiments of the present invention. While the device 100 may be implemented as a cellular telephone, the device 100 represents a wide variety of mobile or non-mobile electronic devices, appliances, point of sale, medical and industrial applications using touch panels and touch screens, including but not limited to portable media devices, MP3 players, mobile phones, messaging devices, personal digital assistants (PDAs), notebook or laptop computers incorporating communication modems, mobile data terminals, application specific gaming devices, video gaming devices incorporating wireless modems, or any other type of electronic device having a keyboard-based input which uses capacitive, proximity or electric field sensors.

As depicted, the device 100 includes a handset casing 130 for assembling a touch sensitive keypad 110, display screen 131, one or more control buttons 132 (e.g., menu button, power switch, etc.), an antenna, a microphone 133, an ear piece 134, and various internal software modules and hardware circuits 140. The depicted keypad 110 has a plurality of key spaces 111-121 which are shown as being arranged in a numeric keypad configuration, though the keypad 110 may be implemented as a QWERTY keypad and/or may include fewer or more keys. The touch sensitive keypad 110 is electronically coupled to provide user input to the internal circuit/modules 140 which include a controller 141, transceiver 142, memory 143, and modules 144. The controller 141 is configured to receive user input from the touch sensitive keypad 110 to specify or execute particular functions of the device.

The modules 144 can include a keypad input receiving module 171 for receiving user input to a keypad of the electronic device, and a keypad decode module 172 for demultiplexing and decoding the detected output from the sensing electrodes in the touch sensitive keypad 110, and a keypad function executing module 173 for executing a function of a mode for keypad input of the electronic device 100 according to the user input to the keypad 110. The modules 144 and others can carry out certain processes of the methods as described herein, and may be implemented in software, such as in the form of one or more sets of prestored instructions, and/or hardware, which can facilitate the operation of the mobile station or electronic device as discussed below. The modules 144 may be installed at the factory or can be installed after distribution by, for example, a downloading operation. The operations in accordance with the modules will be discussed in more detail below.

Figure 2:
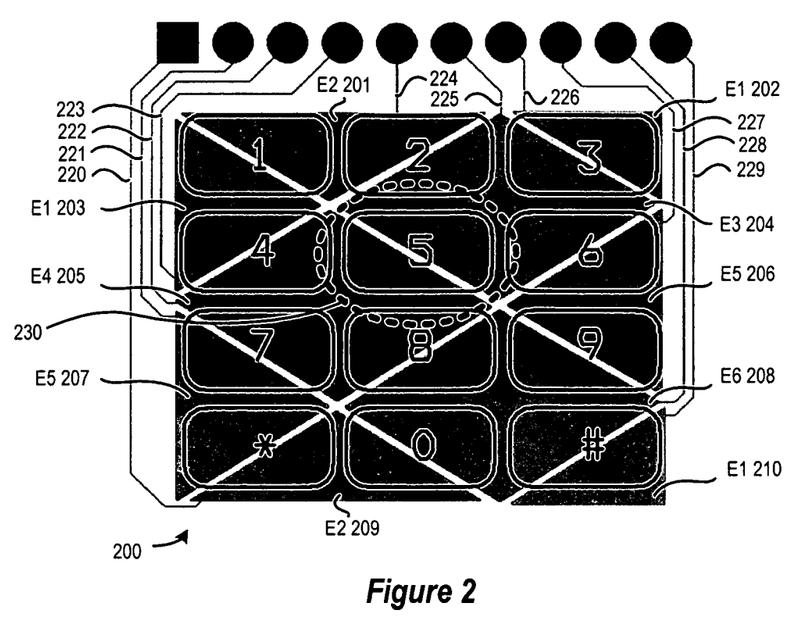
FIG. 2 schematically shows in plan view a two-dimensional capacitive position sensor in accordance with selected embodiments of the present invention.

FIG. 2 shows a closer view of the touch sensitive keypad 110 by schematically illustrating in plan view a two-dimensional capacitive position sensor 200 in accordance with selected embodiments of the present invention. The depicted capacitive position sensor 200 includes multiple electrodes 201-210 and associated wire connectors 220-229 which may all be formed in a single layer of conductive material, where the electrodes 201-210 are arrayed in relation to a keypad to form combinations of two electrodes per key, where each electrode is shared with only immediately adjacent keys. While any desired geometries or shapes may be used, selected embodiments of the present invention employ rhomboid or diamond shapes for the electrodes 201-210 to ensure that each key uses two electrodes with the same area per key, where each of the two electrodes is sized and arranged so that it is shared by only surrounding or immediately adjacent keys. In this example, the first electrode (e.g., electrode E4 205) used for the "5" key is sized and arranged so that it is shared by only the surrounding "4," "7," and "8" keys, while the second electrode (e.g., electrode E3 204) used for the "5" key is sized and arranged so that it is shared by only the surrounding "2," "3" and "6" keys.

To minimize the number of electrodes required for the keypad 200 and to compensate for the load capacitance for all electrodes (which takes into account the steady state capacitance value when no key is pressed), the electrodes may be logically arranged so that selected keys located in one side edge of the keypad are logically treated as being immediately adjacent to selected keys located on the opposite side edge of the keypad. An example arrangement depicted in FIG. 2 shows that incomplete rhomboid-shaped electrodes (e.g., electrode E1 202 and electrode E1 210) from the right side of the keypad can be completed with incomplete rhomboids on the left side of the keypad (e.g., electrode E1 203), and incomplete rhomboids from the top side of the keypad (e.g., electrode E2 201) can be completed with incomplete rhomboid-shaped electrodes on the bottom side of the keypad (e.g., electrode E2 209), and so on. With this arrangement, an example 12 key numeric keypad for a cell phone could be created with only six logical electrodes, where each logical electrode has at least twice the area of each individual key area and is shared with four internally and/or peripherally adjacent keys without extending across an entire row or column of keys on the keypad. In the example depicted in FIG. 2, a first capacitive electrode E1 may be shared by the "1," "4" "3," and "#" keys; a second capacitive electrode E2 may be shared by the "1," "2," "*," and "0" keys; a third capacitive electrode E3 may be shared by the "2" "3," "5," and "6" keys; a fourth capacitive electrode E4 may be shared by the "4," "5," "7," and "8" keys; a fifth capacitive electrode E5 may be shared by the "6," "7," "9," and "*" keys; and a sixth capacitive electrode E6 may be shared by the "8," "9," "0," and "#" keys. Thus, the keys at the periphery of the keypad (e.g., the "9" key) use two electrodes (e.g., electrode E5 206 and electrode E6 208), where the first electrode (e.g., electrode E5 206) is sized and arranged so that it is shared by only the internally adjacent "6" key and the peripherally adjacent "7" and "*" keys which are immediately adjacent to one another and the "9" key, even though located on another peripheral side of the keypad. In similar fashion, the second electrode (e.g., electrode E6 208) is sized and arranged so that it is shared by only the internally adjacent "0." "8," and "#" keys which are immediately adjacent to one another and to the "9" key, even though located within the interior of the keypad. In this sense, the reference to an electrode for a first key being shared by immediately adjacent keys refers to one or more additional keys that are vertically or horizontally adjacent to one another (either peripherally or internally), provided that at least one of the additional keys is vertically or horizontally adjacent to the first key (either peripherally or internally), and does not include an arrangement where all keys in a given row or column share the electrode. Thus, a first key at one peripheral side of the keypad (e.g., the "3" key) may use a first sensing electrode (e.g., electrode E1 202) that is shared by immediately adjacent keys in the vertical direction (e.g., the peripherally adjacent "#" key) and in the horizontal direction (e.g., the peripherally adjacent "1" key), which in turn is internally adjacent to the immediately adjacent "4" key in the vertical direction when the first sensing electrode (e.g., electrode E1 202) is electrically and/or logically connected to a second sensing electrode (e.g., electrode E1 203 or E1 210). Stated another way, the "3," "1," "4," and "#" keys are vertically or horizontally adjacent to one another, either peripherally or internally, without extending across an entire row or column of the keypad.

It will be appreciated that other arrangements of the shared electrodes and keys can be used so that each key is detected with a combination of two capacitive electrodes, where each capacitive electrode is shared by four keys that are internally and/or peripherally adjacent to one another without extending across an entire row or column of the keypad. For example, a first capacitive electrode may be shared by the "4," "5," "7," and "8" keys; a second capacitive electrode may be shared by the "2," "3," "5," and "6" keys; a third capacitive electrode may be shared by the "1," "4," "6," and "9" keys; a fourth capacitive electrode may be shared by the "8," "9," "0," and "#" keys; a fifth capacitive electrode may be shared by the "1," "2," "*," and "0" keys; and a sixth capacitive electrode may be shared by the "3," "7," "*," and "#" keys.

With FIG. 2's depicted configuration of electrodes 201-210 under the specified keys (0-9, * and #), each common electrode that is shared by a key will be used by four immediately adjacent keys at the same time with no need for having any clearance or discontinuity between keys while maximizing the electrode area and increasing the logic combinations. The larger electrode size results in improved capacitive detection of a touch, but by confining each electrode to be shared by only immediately adjacent keys, potential interference caused by touching part of a surrounding key can be readily resolved with a multiplex decoding logic which senses a touch to one of the keys by detecting changes in electrical signals present at predetermined combinations of the electrodes 201-210. As a result, the capacitive position sensor 200 is well suited for scenarios where keys are smaller than the size of the touching finger and proximity between keys is so close that partially detection by surrounding keys cannot be avoided.

With this logic arrangement, the capacitive position sensor 200 accurately senses a touch to one of the keys by detecting and decoding changes in electrical signals present at the electrodes 201-210 in the vicinity of a touch, even when there is interference caused by partially touching another key. For example, if the "5" key is pressed by a finger (as indicated by the dashed touch area 230), the capacitive position sensor 200 uses a first electrode E4 205 and a second electrode E3 204 to sense the touch location on the keypad, where both of the first and second electrodes E4 205 and E3 204 in the area 230 touched by the finger both are capacitively coupled to ground by the conductivity of finger, thereby providing an electrical signal over the associated wire connectors 222, 225 to the controller electronics (not shown). Because the amount of capacitive coupling to each electrode (and therefore the change in the signal on the electrode) varies with the size of overlap between the touch area 230 and the underlying electrode, the multiplex decoding logic can readily distinguish potential interference signals caused by the finger partially touching another key. Thus, if the "5" key is pressed while partially touching the "2," "4," "6," and "8" keys (as indicated by the dashed touch area 230, the first and second electrodes E4 205, E3 204 are still the only affected electrodes. Indeed, even if the finger touching the "5" key partially overlaps with the electrodes under the partially touched keys, the much larger capacitive coupling of the two electrodes E4 205, E3 204 that form the "5" key will be readily and accurately detected without requiring complex software to decide whether a key is valid or not. Thus, the proposed keypad scheme works well in situations, such as hand held devices, where the finger is bigger than the keypad key. In contrast, in a conventional XY multiplex keypad detection scheme, pressing the "5" key would be simultaneously detected as changes for the "2," "8," "4," and "6" keys that would need to be distinguished from one another with a detection algorithm for distinguishing a valid key. Another advantage of not arranging the electrodes 201-210 in a conventional XY multiplex fashion is that electrode routing can be accomplished in a single layer, and therefore can be easily implemented in a single sided PCB, ITO (for touch screens) or flexible membranes. Also, since conventional proximity sensing devices select only one channel at the time while the other channels are grounded, the virtual ground issue is solved in battery-operated applications having an accurate and referenced electric field flow to system ground.

Figure 3:
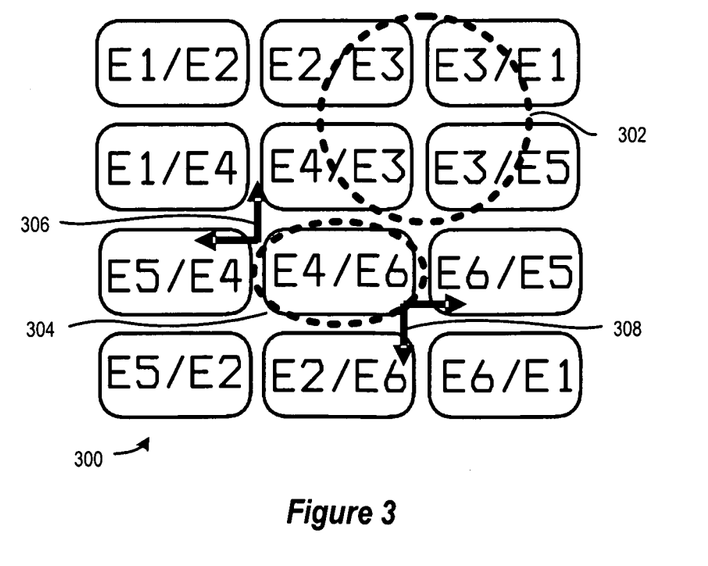
FIG. 3 illustrates the decoding logic for each unique electrode pairing and its corresponding key in the keypad.

To illustrate how the common electrode sharing scheme described herein can be used to detect which key is being touched, FIG. 3 illustrates an example multiplex decoding logic which matches a unique electrode pairing with a corresponding key in the keypad. As shown, a touch of the "1" key is sensed when changes in electrical signals present at the E1 and E2 electrodes are detected. In similar fashion, a touch of the "2" key is sensed when changes in electrical signals present at the E2/E3 electrodes are detected, and so on with the remaining keys 3-9, *, 0, and # which are detected as being touched when changes in electrical signals are detected at the E3/E1, E1/E4, E4/E3, E3/E5, E5/E4, E4/E6, E6/E5, E5/E2, E2/E6, and E6/E1 electrodes, respectively. With this configuration, up to four keys share a single shared or common electrode, but a common electrode is not shared by all of the keys on a given row or column, only with immediately adjacent keys. For example, the E3 electrode is large enough to be shared with the "2", "5" "6," and "3" keys (as indicated with the example dashed grouping line 302), but is not shared by the column of "2," "5," "8," and "0" keys, or by the row of "4," "5," and "6" keys. By multiplexing each key with a unique combination of electrodes so that each electrode is only shared by immediately adjacent keys without being shared by all keys in a given row or column of the keypad, 2n keys in a keypad can be readily identified with n electrodes which each have at least twice the area of a single key. In FIG. 3, this multiplexing arrangement means that the E4 electrode used to detect the "8" key (as indicated by dashed line 304) is only shared with the immediately adjacent "4," "5," and "7" keys (as indicated by the vertical and horizontal arrows 306), while the other E6 electrode used to detect the "8" key (as indicated by dashed line 304) is only shared with the immediately adjacent "9," "0," and "#" keys (as indicated by the vertical and horizontal arrows 308). Likewise, the E1 electrode used to detect the "3" key is only shared with the immediately adjacent "1," "4," and "#" keys, while the other E3 electrode used to detect the "3" key is only shared with the immediately adjacent "2," "5," and "6" keys.

Figure 4:
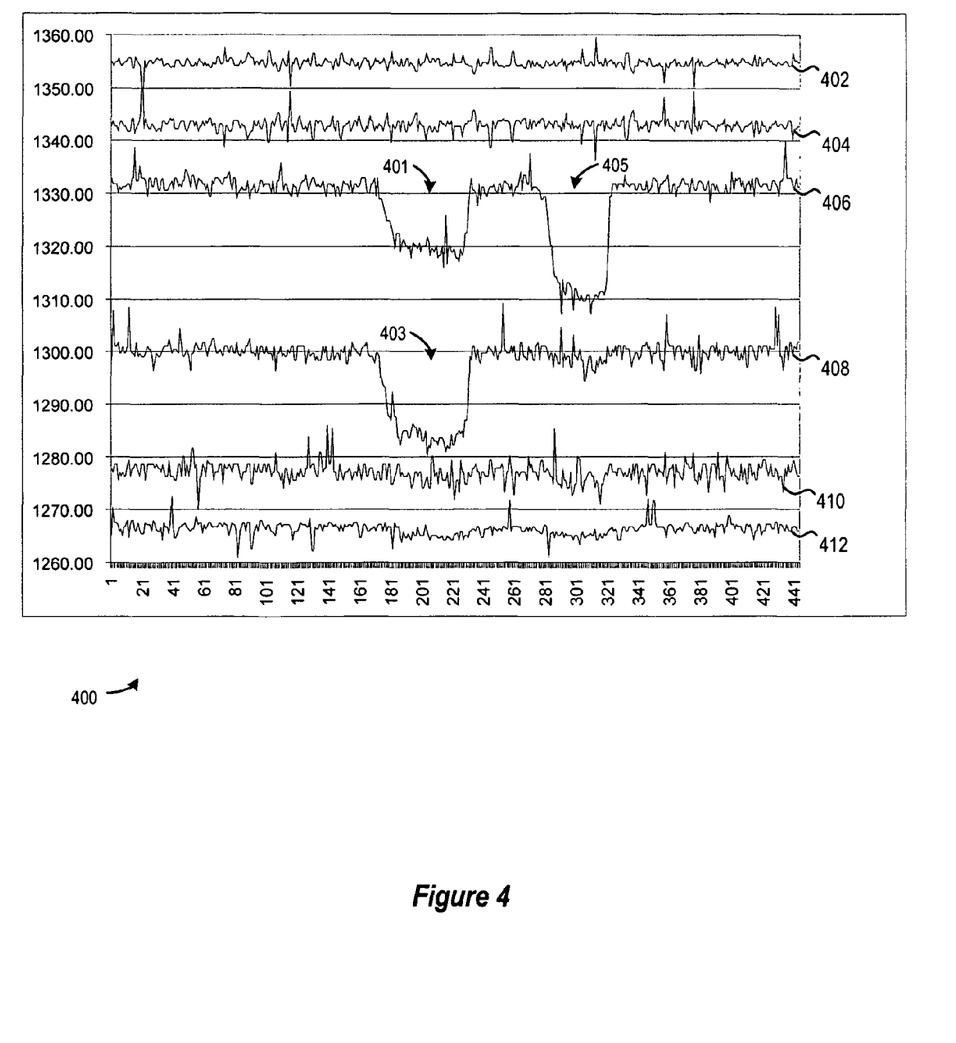
FIG. 4 is a graph of example output response curves for the touch panel sensing electrodes in accordance with selected embodiments of the present invention.

To illustrate how the unique electrode pairings are detected by the capacitive position sensor, reference is now made to FIG. 4 which graphically depicts example output response curves 400 for the touch panel sensing electrodes in accordance with selected embodiments of the present invention. In this simulation, the response signal 402 represents the electrical signal present at a first electrode (e.g., electrode E1 shown in FIG. 2 as the electrically connected electrodes 202, 203, and 210). In similar fashion, the response signal 404 represents the electrical signal present at a second electrode (e.g., electrode E2 shown in FIG. 2 as the electrically connected electrodes 201 and 209); the response signal 406 represents the electrical signal present at a third electrode (e.g., electrode E3 shown in FIG. 2 as electrode 204); the response signal 408 represents the electrical signal present at a fourth electrode (e.g., electrode E4 shown in FIG. 2 as the electrode 205); the response signal 410 represents the electrical signal present at a fifth electrode (e.g., electrode E5 shown in FIG. 2 as the electrically connected electrodes 206 and 207); and the response signal 412 represents the electrical signal present at a sixth electrode (e.g., electrode E6 shown in FIG. 2 as the electrode 208). In the depicted simulation curves 400, resolution is given for a 12-bit ADC converter in a touch panel which uses a glass dielectric panel layer that is 4 mm thick. As indicated by the response signals 406, 408 which correspond to the third and fourth electrodes E3/E4, the "5" key has been touched, causing the electrical signals at the third and fourth electrodes to change as shown by the signal troughs 401, 403, respectively. The changes in the response signals 406, 408 are decoded at the multiplex decode logic to identify the "5" key as being pressed. Because of the relatively larger size and geometric placement of the shared sensing electrodes, the electrodes are able to detect or sense more electric field variations, therefore have more sensitivity to detecting touches. For example, while the sensitivity of a conventional XY multiplex keypad detection scheme for meeting a predetermined threshold voltage requirement (e.g., 24 mV) is approximately 20 ADC samples or counts for a valid touch, selected embodiments of the present invention may be used to improve sensitivity for meeting a predetermined threshold voltage requirement (e.g., 36 mV) to approximately 30 ADC samples or counts for a valid touch, thereby improving sensitivity by approximately 50%. Thus, both the triggering threshold voltage and the detection duration are improved.

At the same time, it is noted that there is very little interference from the non-touched keys, as indicated by the relatively flat response signals 402, 404, 410, and 412 which is the result expected from having each key share two, over-sized electrodes, where each electrode is shared with only immediately adjacent keys. In addition, the decoding scheme is able to ignore signal fluctuations, such as the signal trough 405 in the response signal 406 which would indicate that an indeterminate touch was made at only the third electrode E3 location.

By now it should be appreciated that there is provided a capacitive keypad position sensor. As disclosed, the keypad position sensor includes a keypad touch panel having a plurality of defined key areas (e.g., the "1" key, the "2" key, etc.). The keypad position sensor also includes a plurality of capacitive electrodes arrayed under the keypad touch panel to define two capacitive electrodes under each defined key area so that each capacitive electrode is shared with four immediately adjacent key areas that are internally or peripherally adjacent to each other without extending across an entire row or column of the keypad touch panel, thereby defining a unique combination of capacitive electrodes for each defined keypad area. As used herein, the reference to a capacitive electrode for a first key area being shared by immediately adjacent key areas refers to one or more additional key areas that are vertically or horizontally adjacent to one another (either peripherally or internally), provided that at least one of the additional key areas is vertically or horizontally adjacent to the first key area (either peripherally or internally), and does not include an arrangement where all key areas in a given row or column share the capacitive electrode. In this way, a plurality of unique combinations of capacitive electrodes may be defined such that each defined keypad area has a unique combination of capacitive electrodes. For example, the capacitive electrodes may be positioned so that a first capacitive electrode located under a first defined key area is also located under three immediately adjacent key areas that are peripherally or internally adjacent to one another such that at least one of the three immediately adjacent key areas is peripherally or internally adjacent to the first defined key area without extending across an entire row or column of the keypad touch panel. In addition or in the alternative, the capacitive electrodes may be formed to include a first capacitive electrode that is shared by "4," "5," "7," and "8" keys; a second capacitive electrode that is shared by "2" "3," "5," and "6" keys; a third capacitive electrode that is shared by "1," "4," "6," and "9" keys; a fourth capacitive electrode that is shared by "8," "9," "0," and "#" keys; a fifth capacitive electrode that is shared by "1," "2," "*," and "0" keys; and a sixth capacitive electrode that is shared by "3," "7," "*," and "#" keys. In selected embodiments, the capacitive electrodes may be formed as rhomboid or diamond shaped capacitive electrodes that are arrayed under the keypad touch panel, where each rhomboid or diamond shaped capacitive electrode is shared by four immediately adjacent defined key areas that are internally adjacent to each other without extending across an entire row or column of the keypad touch panel. In addition or in the alternative, the capacitive electrodes may be formed as triangle shaped capacitive electrodes that are positioned at one or more peripheral sides of the keypad touch panel, where each triangle shaped capacitive electrode is electrically or logically connected to at least one other triangle shaped capacitive electrode located on another peripheral side of the keypad touch panel to define a common capacitive electrode that is shared with only four immediately adjacent key areas that are peripherally adjacent to each other without extending across an entire row or column of the keypad touch panel. As formed, the capacitive electrodes may include one or more electrode elements having a single continuous area that is at least twice as large as a defined key area. The capacitive electrodes may be formed over a substrate in a single conductive layer, alone or in combination with a plurality of wire conductors, where each wire conductor is electrically coupled to each of the plurality of capacitive electrodes and is formed over the substrate in the single conductive layer. The keypad position sensor may also include a controller that is configured to determine which of the plurality of defined key areas is being touched by detecting a predetermined signal characteristic at one of the plurality of unique combinations of capacitive electrodes.

In another form, there is provided an electronic device which includes a controller that is coupled to a keypad which is configured to receive user input. The keypad includes a keypad touch panel having a bottom surface and a top surface having a plurality of key areas for receiving user contact. The keypad also includes capacitive electrodes formed adjacent to the bottom surface of the keypad touch panel, where the capacitive electrodes are positioned in relation to the keypad touch panel to form a unique combination of at least two capacitive electrodes for each key area, and where each capacitive electrode is shared with a plurality of immediately adjacent key areas that are internally or peripherally adjacent to one another without extending across an entire row or column of the keypad. As formed, each capacitive electrode is at least twice as large as any key area, and may be formed in a single conductive layer, alone or in combination with one or more wire conductors, where each wire conductor is electrically coupled to the capacitive electrodes. In addition, the controller may be configured to determine which of the plurality of key areas is being touched by detecting which unique combination of at least two capacitive electrodes has a predetermined signal characteristic which is caused by receiving user contact on the top surface of the keypad touch panel in a key area over said unique combination of at least two capacitive electrodes. In selected embodiments, the capacitive electrodes are formed to include a first capacitive electrode that is shared by "4," "5," "7," and "8" key areas; a second capacitive electrode that is shared by "2," "3," "5," and "6" key areas; a third capacitive electrode that is shared by "1," "4," "6," and "9" key areas; a fourth capacitive electrode that is shared by "8," "9," "0," and "#" key areas; a fifth capacitive electrode that is shared by "1," "2," "*," and "0" key areas; and a sixth capacitive electrode that is shared by "3," "7," "*," and "#" key areas. In other embodiments, the capacitive electrodes are formed to include a first capacitive electrode that is shared by "1," "4," "3," and "#" key areas; a second capacitive electrode that is shared by "1," "2," "*," and "0" key areas; a third capacitive electrode that is shared by "2," "3," "5," and "6" key areas; a fourth capacitive electrode that is shared by "4," "5," "7," and "8" key areas; a fifth capacitive electrode that is shared by "6," "7," "9," and "*" key areas; and a sixth capacitive electrode that is shared by "8," "9," "0," and "#" key areas. For example, rhomboid or diamond shaped capacitive electrodes may be arrayed adjacent to the bottom surface of the keypad touch panel to define at least two capacitive electrodes of substantially the same area under each defined key area so that each capacitive electrode is shared with only four immediately adjacent key areas. In addition or in the alternative, triangle shaped capacitive electrodes may be positioned at each peripheral side of the keypad touch panel, where each triangle shaped capacitive electrode is electrically or logically connected at least one other triangle shaped capacitive electrode located on another peripheral side of the keypad touch panel to define a common capacitive electrode that is shared with only four immediately adjacent key areas. In this way, the keypad can use only six capacitive electrodes to uniquely identify twelve defined key areas in a numeric keypad.

In yet another form, there is provided a method for detecting user contact at a keypad. In the disclosed methodology, a user input touch is received at one of a plurality of defined key areas on an exterior surface of a keypad panel. In response, a determination is made as to which of the plurality of defined key areas is being touched by detecting a predetermined signal characteristic at one of a plurality of unique combinations of capacitive electrodes arrayed adjacent to an interior surface of the keypad panel, where the plurality of capacitive electrodes are positioned in relation to the keypad panel to form unique combinations of at least two capacitive electrodes per defined key area so that each capacitive electrode is shared with only internally or peripherally adjacent keys without extending across an entire row or column of keys on the keypad panel.

Although the described exemplary embodiments disclosed herein for an enhanced capacitive keypad design are described with reference to various mobile communication devices, the present invention is not necessarily limited to the example embodiments illustrate herein. For example, various embodiments may be implemented in industrial equipment or home appliance using a touch panel, point of sales with touch screen, portable electronics as cell phones or MP3 players, medical equipment and almost any device using touch panels or keypad touch screens. The methods and systems for enhancing the design of a capacitive keypad as shown and described herein may be implemented using a variety of different electrode shapes and geometries, provided that a single logical electrode is shared by multiple key areas in a multiplexing configuration that reduces or eliminates interference between electrodes. By using diamond, rhomboid and triangle shaped electrodes to form individual logic electrodes that have an area that is at least twice as large as a single key area, a capacitive touch panel keypad may be implemented that meets the keypad design restrictions, such as maximum keypad area, keys size and close proximity between keys. The enhanced design of the electrode shape and layout also saves costs by providing an efficient technique that can be implemented in touch screens, touch panels or capacitive membranes with a relatively thick dielectric and using only one electric field or proximity sensor, implemented in a single conductor layer and without the lost of sensitivity experimented with current multiplexing techniques. In addition, the enhanced design allows valid keys to be readily differentiated without complex detection software algorithms. Indeed, the multiplex decoding scheme may be implemented with any combination of computer programming software, firmware or hardware that is configured to determine which of the plurality of defined key areas is being touched by detecting a predetermined signal characteristic at one of the plurality of unique combinations of capacitive electrodes. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments.

However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A capacitive keypad position sensor, comprising: a keypad touch panel comprising a plurality of defined key areas; and
   a plurality of capacitive electrodes arrayed under the keypad touch panel to define two capacitive electrodes under each defined key area so that each capacitive electrode of the plurality of capacitive electrodes is shared with four immediately adjacent key areas that are internally or peripherally adjacent to each other and extends only partially across an entire row of the keypad touch panel and extends only partially across an entire column of the keypad touch panel, thereby defining a unique combination of capacitive electrodes for each defined keypad area.

2. The capacitive position sensor of claim 1, further comprising a controller configured to determine which of the plurality of defined key areas is being touched by detecting a predetermined signal characteristic at one of the plurality of unique combinations of capacitive electrodes.

3. The capacitive position sensor of claim 1, where the plurality of capacitive electrodes are formed over a substrate in a single conductive layer.

4. The capacitive position sensor of claim 3, further comprising a plurality of wire conductors, where each wire conductor is electrically coupled to one of the plurality of capacitive electrodes and is formed over the substrate in the single conductive layer.

5. The capacitive position sensor of claim 1, where the plurality of capacitive electrodes comprises an electrode element having a single continuous area that is at least twice as large as a defined key area.

6. The capacitive position sensor of claim 1, where the plurality of capacitive electrodes are positioned so that a first capacitive electrode located under a first defined key area is also located under three immediately adjacent key areas that are peripherally or internally adjacent to one another such that at least one of the three immediately adjacent key areas is peripherally or internally adjacent to the first defined key area without extending across an entire row or column of the keypad touch panel.

7. The capacitive position sensor of claim 1, where the plurality of capacitive electrodes comprise:
   a first capacitive electrode that is shared by "4," "5," "7," and "8" keys;
   a second capacitive electrode that is shared by "2," "3," "5," and "6" keys;
   a third capacitive electrode that is shared by "1," "4," "6," and "9" keys;
   a fourth capacitive electrode that is shared by "8," "9," "0," and "#" keys;
   a fifth capacitive electrode that is shared by "1," "2," "*," and "0" keys; and
   a sixth capacitive electrode that is shared by "3," "7," "*," and "#" keys.

8. The capacitive position sensor of claim 1, where the plurality of capacitive electrodes comprises a plurality of rhomboid or diamond shaped capacitive electrodes that are arrayed under the keypad touch panel, where each rhomboid or diamond shaped capacitive electrode is shared by four immediately adjacent defined key areas that are internally adjacent to each other without extending across an entire row or column of the keypad touch panel.

9. The capacitive position sensor of claim 1, where the plurality of capacitive electrodes comprises a plurality of triangle shaped capacitive electrodes that are positioned at one or more peripheral sides of the keypad touch panel, where each triangle shaped capacitive electrode is electrically or logically connected to at least one other triangle shaped capacitive electrode located on another peripheral side of the keypad touch panel to define a common capacitive electrode that is shared with only four immediately adjacent key areas that are peripherally adjacent to each other without extending across an entire row or column of the keypad touch panel.

10. An electronic device, comprising:
    a controller; and
    a keypad coupled to the controller and configured to receive user input, the keypad comprising:
    a keypad touch panel comprising a first surface and a second surface having a plurality of key areas for receiving user contact; and
    a plurality of capacitive electrodes located adjacent to the first surface of the keypad touch panel, where the plurality of capacitive electrodes are positioned in relation to the keypad touch panel to form a unique combination of at least two capacitive electrodes for each key area, and where each capacitive electrode is shared with a plurality of immediately adjacent key areas that are internally or peripherally adjacent to one another and extends only partially across an entire row of the keypad and extends only partially across an entire column of the keypad.

11. The electronic device of claim 10, where each capacitive electrode is at least twice as large as any key area.

12. The electronic device of claim 10, where the controller is configured to determine which of the plurality of key areas is being touched by detecting which unique combination of at least two capacitive electrodes has a predetermined signal characteristic which is caused by receiving user contact on the first surface of the keypad touch panel in a key area over said unique combination of at least two capacitive electrodes.

13. The electronic device of claim 10, where the plurality of capacitive electrodes are formed in a single conductive layer.

14. The electronic device of claim 13, further comprising a plurality of wire conductors, where each wire conductor is electrically coupled to one of the plurality of capacitive electrodes and is formed in the single conductive layer.

15. The electronic device of claim 10, where the plurality of capacitive electrodes comprise:
    a first capacitive electrode that is shared by "4," "5," "7," and "8" key areas;
    a second capacitive electrode that is shared by "2," "3," "5," and "6" key areas;
    a third capacitive electrode that is shared by "1," "4," "6," and "9" key areas;
    a fourth capacitive electrode that is shared by "8," "9," "0," and "#" key areas;
    a fifth capacitive electrode that is shared by "1," "2," "*," and "0" key areas; and
    a sixth capacitive electrode that is shared by "3," "7," ";" and "#" key areas.

16. The electronic device of claim 10, where the plurality of capacitive electrodes comprise:
- a first capacitive electrode that is shared by "1," "4," "3," and "#" key areas;
- a second capacitive electrode that is shared by "1," "2," "*," and "0" key areas;
- a third capacitive electrode that is shared by "2," "3," "5," and "6" key areas;
- a fourth capacitive electrode that is shared by "4," "5," "7," and "8" key areas;
- a fifth capacitive electrode that is shared by "6," "7," "9," and "*" key areas; and
- a sixth capacitive electrode that is shared by "8," "9," "0," and "#" key areas.

17. The electronic device of claim 10, where the plurality of capacitive electrodes comprises a plurality of rhomboid or diamond shaped capacitive electrodes that are arrayed adjacent to the first surface of the keypad touch panel to define at least two capacitive electrodes of substantially the same area under each defined key area so that each capacitive electrode is shared with only four immediately adjacent key areas.

18. The electronic device of claim 10, where the plurality of capacitive electrodes comprises a plurality of triangle shaped capacitive electrodes that are positioned at each peripheral side of the keypad touch panel, where each triangle shaped capacitive electrode is electrically or logically connected at least one other triangle shaped capacitive electrode located on another peripheral side of the keypad touch panel to define a common capacitive electrode that is shared with only four immediately adjacent key areas.

19. The electronic device of claim 10, where the keypad uses only six capacitive electrodes to uniquely identify twelve defined key areas in a numeric keypad.

20. A method for detecting user contact at a keypad, comprising:
- receiving a user input touch at one of a plurality of defined key areas on an exterior surface of a keypad panel; and
- determining which of the plurality of defined key areas is being touched by detecting a predetermined signal characteristic at one of a plurality of unique combinations of capacitive electrodes arrayed adjacent to an interior surface of the keypad panel, where the plurality of capacitive electrodes are positioned in relation to the keypad panel to form unique combinations of at least two capacitive electrodes per defined key area so that each capacitive electrode is shared with only internal or peripherally adjacent key areas and extends only partially across an entire row of the keypad panel and extends only partially across an entire column of the keypad panel.

* * * * *

UNITED STATES PATENT AND TRADEMARK OFFICE
CERTIFICATE OF CORRECTION

PATENT NO. : 8,497,786 B2  
APPLICATION NO. : 12/411623  
DATED : July 30, 2013  
INVENTOR(S) : Oscar Alejandro Camacho and Daniel G. Morfin Page 1 of 1

It is certified that error appears in the above-identified patent and that said Letters Patent is hereby corrected as shown below:

In the Claims:

Column 12, line 66 should read "a sixth capacitive electrode that is shared by "3," "7," "*,"

Signed and Sealed this  
Twenty-fourth Day of September, 2013

Teresa Stanek Rea  
*Deputy Director of the United States Patent and Trademark Office*